United States Patent [19]

Schmitt

[11] 4,423,958
[45] Jan. 3, 1984

[54] TEST APPARATUS FOR DIGITAL PHOTOELECTRIC LENGTH OR ANGLE MEASURING INSTRUMENT

[75] Inventor: Walter Schmitt, Hochgernstrasse 22, D-8225, Traunreut, Fed. Rep. of Germany

[73] Assignee: Dr. Johannes Heidenhain GmbH, Traunreut, Fed. Rep. of Germany

[21] Appl. No.: 245,105

[22] Filed: Mar. 18, 1981

[30] Foreign Application Priority Data

Mar. 20, 1980 [DE] Fed. Rep. of Germany ....... 3010611

[51] Int. Cl.³ ................... G01B 11/00; G01D 18/00
[52] U.S. Cl. .................... 356/375; 250/214 R; 250/231 SE; 356/243; 356/395
[58] Field of Search ................. 356/373–375, 356/395–396, 243, 383, 256; 250/231 R, 231 SE, 214 R, 214 DC, 237 R, 237 G, 252, 561; 307/311, 351, 362

[56] References Cited

U.S. PATENT DOCUMENTS

| | | | |
|---|---|---|---|
| 2,791,696 | 5/1957 | Schell | 250/237 R |
| 2,812,445 | 11/1957 | Anderson | 307/311 |
| 2,994,783 | 8/1961 | Looschen | 250/561 |
| 3,808,431 | 4/1974 | Hedrick | 250/231 SE |
| 4,330,831 | 5/1982 | Schwefel | |

*Primary Examiner*—William H. Punter
*Attorney, Agent, or Firm*—Willian, Brinks, Olds, Hofer, Gilson & Lione Ltd.

[57] ABSTRACT

A digital photoelectric angle or length measuring instrument, of the type having a scale with at least one division, a scanning unit for scanning the division to generate a scanning signal, and an evaluating unit having a trigger circuit for evaluating the scanning signal, is provided with means for generating at least one test signal and means for selectively applying the test signal either to the trigger circuit or to a light source such that the trigger threshold of the trigger circuit is temporarily varied by a selected amount, thereby providing a simple, reliable check of the trigger threshold of the trigger circuit, without requiring external equipment or disassembly of the measuring instrument.

16 Claims, 3 Drawing Figures

TEST APPARATUS FOR DIGITAL PHOTOELECTRIC LENGTH OR ANGLE MEASURING INSTRUMENT

BACKGROUND OF THE INVENTION

This invention relates to a test apparatus for testing the trigger threshold of a trigger circuit in a digital photoelectric length or angle measuring instrument of the type having a scale which bears at least one division, a scanning unit for scanning the division to generate the scanning signal, and an evaluating unit for evaluating the scanning signal.

In such a photoelectric length or angle measuring instrument it is critically important that the trigger thresholds be properly adjusted if erroneous measurements are to be avoided. Often, such adjustment must be repeated periodically since the original trigger threshold adjustment can change in the course of time due to the aging of electronic components of the scanning unit or the evaluating unit or of the illuminating system of the scanning unit. In the past, this adjustment of the trigger threshold has often been done in a time consuming manner with the assistance of an oscilloscope. During such time consuming rechecking of the adjustment of the trigger thresholds, the measuring instrument is unavailable for its intended function. This can result in considerable down times which can interfere with the availability of the measuring instrument.

SUMMARY OF THE INVENTION

The present invention is directed to an improved testing apparatus for an absolute or an incremental length or angle measuring instrument, which permits the adjustment of the trigger thresholds of the trigger circuits of the evaluating unit to be rechecked in a particularly simple, reliable manner, with minimal interruption of normal instrument operation.

According to this invention, a digital photoelectric position measuring instrument of the type described above is provided with means for generating at least one test signal and means for selectively applying the test signal to the trigger circuit temporarily to vary a trigger threshold of a trigger circuit by a selected amount. The generating means and the applying means operate to provide a simple, reliable check of the trigger threshold of the trigger circuit. In an alternate embodiment of this invention, the test signal is applied to a light source of the scanning unit rather than directly to the trigger circuit. In this second embodiment the brightness of the light source is temporarily varied by a selected amount in order to achieve the same result.

This invention provides a number of important advantages. In particular, the trigger thresholds of many measuring instruments equipped with the test circuit of this invention can readily be checked from the outside of the instrument, without a substantial interruption in the normal operation of the measuring instrument. In this way the time required to check trigger thresholds is markedly reduced, making it feasible to check trigger thresholds more often without interfering with normal measuring instrument operation. In addtion, when the test apparatus of this invention is of the type which provides variable testing ranges for the trigger thresholds, it is possible to observe and track the trend of changes in trigger thresholds, so that necessary readjustment can be carried out before the trigger thresholds drift out of specification. Furthermore, when the test apparatus of this invention is used in conjunction with measuring devices of the type which employ several light-emitting diodes to illuminate the scale, which diodes can age differently, the invention can be used to track premature brightness loss of these diodes. Further advantageous features of this invention are set forth in the dependent claims which follow.

The invention itself, together with further objects and attendant advantages, will best be understood by reference to the following detailed description taken in connection with the accompanying drawings.

DETAILED DESCRIPTION OF THE PREFERRED EMBODIMENTS

Figure 1:
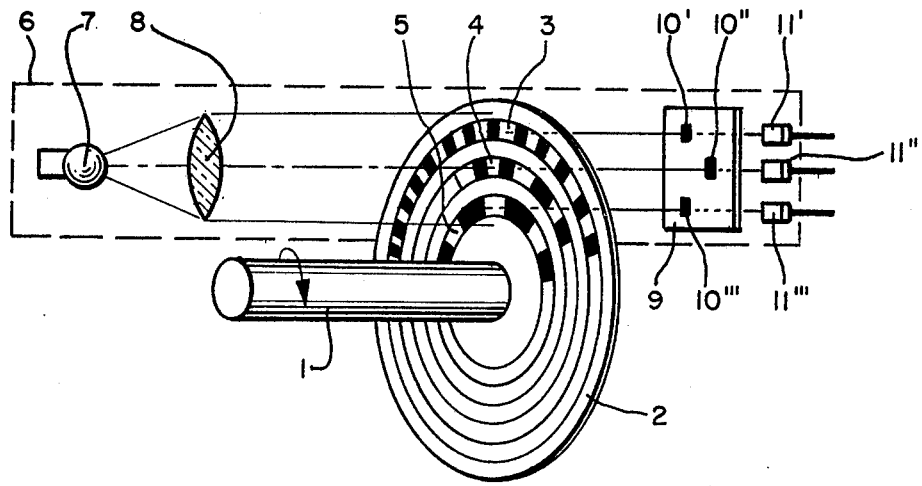
FIG. 1 is a schematic representation of an absolute angle measuring instrument.

Turning now to the drawings, FIG. 1 provides a schematic representation of an absolute angle measuring system which incorporates a measuring scale 2 which is mounted to rotate on a shaft 1. This scale 2 is a transparent disc on which are arranged three concentric division tracks: an incremental division track 3 of high resolution and two coded division tracks 4, 5, of increasingly lower resolution. The measuring instrument of FIG.1 also includes a scanning unit 6 which includes a light source 7, a condensor lens 8, and a scanning plate 9. The scanning plate 9 is mounted to remain stationary with respect to the rotating scale 2, and the scanning plate 9 defines a scanning field 10' for the incremental division track 3 and scanning fields 10'', 10''' for the coded division tracks 4, 5, respectively. In addition, the scanning unit 6 includes three photodiodes 11', 11'', 11''', each of which is aligned with a respective one of the three scanning fields 10', 10'', 10'''.

Figure 2:
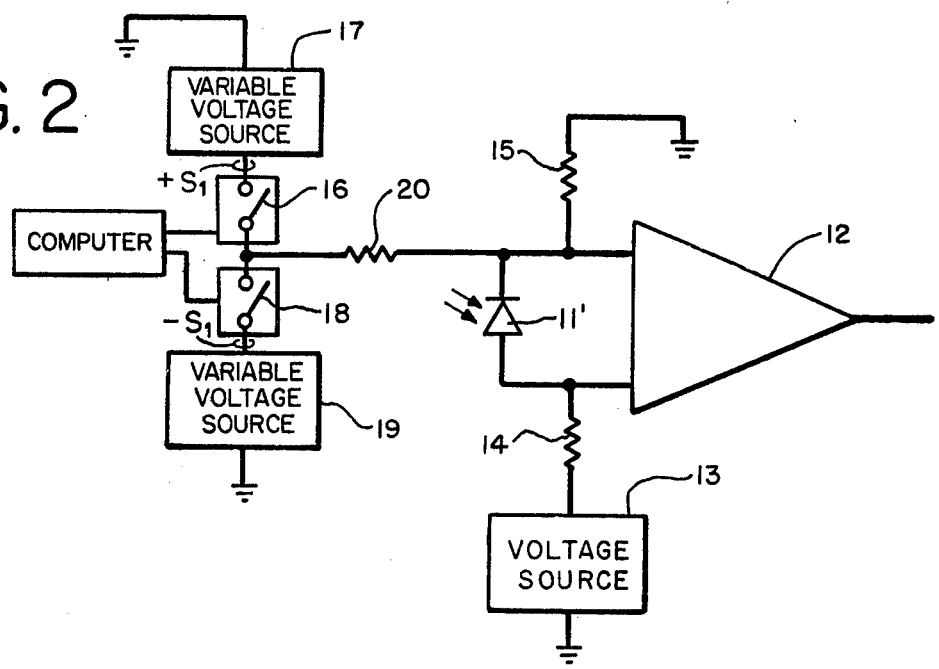
FIG. 2 is a schematic diagram of a photoelectric circuit which incorporates a first preferred embodiment of the present invention.

As shown in FIG. 2 the photodiode 11' is connected across the two inputs of a trigger circuit 12 which is included in an evaluation unit for evaluating the output signal of the photodiode 11'. The trigger threshold of the trigger circuit 12 is adjusted such that the output signal generated by the trigger circuit 12 triggers at the desired voltage. This adjustment is performed by means of a voltage source 13 which is connected to an input of the trigger circuit 12 by means of a resistor 14. An additional resistor 15 connects the other input of the trigger circuit 12 to ground. The resistor 15, in conjunction with the resistor 14 and the voltage source 13, cooperate to establish the working range of the trigger circuit 12. According to this invention a pair of additional voltage sources 17, 19 is provided, each of which generates a direct voltage test signal $+S_1$, $-S_1$, respectively. The voltage source 17 is connected to the trigger circuit 12 by means of a switch 16 and a resistor 20. Similarly, the voltage source 19 is connected to the trigger circuit 12 by means of a switch 18 and the resistor 20. During normal operation of the measuring instrument of FIG. 1, both switches 16, 18 are in the open position as shown in FIG. 2 and the instrument operates normally. By selectively closing either switch 16 or switch 18 it is possible to apply either the test signal $+S_1$ or the test signal $-S_1$ to the trigger circuit 12. The switches 16, 18 can either be manually operable in order to allow an operator of the measuring instrument of FIG. 1 selectively to check the trigger threshold of the trigger circuit 12, or alternatively the switches 16, 18 can be adapted for computer control.

In order to check the adjustment of the trigger threshold of the trigger circuit 12, switch 16 can be closed to apply the test signal $+S_1$ to the trigger circuit 12, thereby raising the trigger threshold by a corresponding amount, and then the switch 18 can be closed to apply the test signal $-S_1$ to the trigger circuit 12 in order to lower the trigger threshold by a corresponding amount. A faulty switching of the trigger circuit 12 when either the test signal $+S_1$ or the test signal $-S_1$ is applied can be perceived by faulty or erroneous positions on the digital position display (not shown) of the measuring system. Thus, the test signals $+S_1$, $-S_1$ serve to define a test range. The magnitude of the test signals $+S_1$, $-S_1$ can be varied by means (not shown) such that differing test ranges are provided. Preferably both a coarse test range and a fine test range are provided. In order to check the adjustment of the trigger threshold of the trigger circuit 12 for the incremental division track 3, it is preferable that the scale 2 be in motion with respect to the scanning unit 6.

The photodiodes 11'', 11''' for the coded division tracks 4, 5 are likewise connected in a similar manner to the inputs of the trigger circuits (not shown), to which the test signals $+S_1$, $-S_1$ are similarly applied in order to allow the adjustment of the respective trigger thresholds to be checked. In this case, faulty switching of the trigger circuits when the test signals $+S_1$, $-S_1$ are applied is indicated by position changes on the standard position display of the measuring instrument which are greater than one bit. Preferably, the adjustment of the trigger thresholds of the trigger circuits for the lower resolution coded division tracks 4, 5 is checked with the measuring scale 2 stationary with respect to the scanning unit 6.

Figure 4:
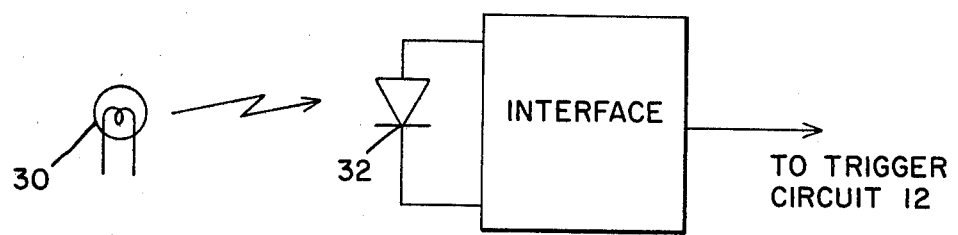

In the first preferred embodiment of FIG. 2 the voltage source 13 and the resistors 14, 15 are used to determine the trigger threshold of the trigger circuit 12. It should be understood that other means can be used to adjust the trigger threshold of the trigger circuit 12. For example, a direct flux light signal can be applied by means of a light source 30 (FIG. 4) to a separate photosensitive element 32 which can, for example, be connected either in parallel or in anti-parallel with the trigger circuit 12. In this alternate embodiment the adjustment of the trigger threshold can be checked by superimposing the test signals $+S_1$, $-S_1$ on the direct flux signal.

Figure 3:
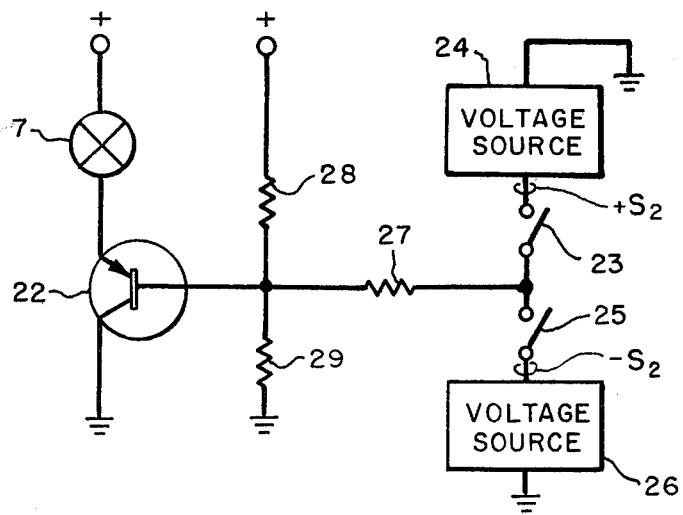
FIG. 3 is a schematic electrical diagram of an electrical circuit which incorporates a second preferred embodiment of the present invention.

A second preferred embodiment of this invention is shown in FIG. 3, in which the light source 7 is connected via one terminal to a positive voltage source and via the other terminal to the emitter of a transistor 22, the collector of which is connected to ground. The base of this transistor 22 is biased in the conventional manner by a first resistor 28 connected between the base and a positive voltage source and a second resistor 29 connected between the base and ground. According to this invention, the base of the transistor 22 can also be acted upon by an electrical signal transmitted via the resistor 27 from one of the two switches 23, 25. The switch 23 operates to connect a direct voltage source 24 which generates a test signal $+S_2$ to the resistor 27, and the switch 25 operates to connect a second direct voltage source 26 which serves to generate a second test signal $-S_2$ to the resistor 27.

The polarities of the test signals $+S_2$, $-S_2$ are chosen such that when the switch 23 is closed the test signal $+S_2$ operates to increase the brightness of the lamp 7, and when the switch 25 is closed the test signal $-S_2$ operates to decrease the brightness of the lamp 7. The magnitude of the test signals $+S_2$, $-S_2$ can be varied by means (not shown) so that differing test ranges can be provided so that the trigger circuits can be tested for proper trigger behavior for varying test ranges. In measuring instruments of the type that incorporate several light-emitting diodes that age differently in the illumination system of the scanning unit, the circuit of FIG. 3 can be used to apply a variable test signal $+S_2$, $-S_2$ in order to determine whether the brightness of individual light-emitting diodes is adequate to provide a suitable safety range to insure accurate switching of the trigger circuits. In this case, the variable test signal $+S_2$, $-S_2$ is chosen such that, in the event the trigger threshold is within a desired range of values, the test signal does not interfere with normal operation of the trigger circuit and the position measuring instrument in measuring the relative position of the scanning unit with respect to the scale. In this manner, dim photodiodes can be changed in time before they actually degrade the accuracy of the measuring instrument.

Of course, it should be understood that various changes and modifications to the preferred embodiments described above will be apparent to those skilled in the art. For example, the switches 16, 18, 23, 25 can either be manually operated by operating personnel in order to provide a manual check of trigger thresholds, or alternately these switches can be automatically controlled at predetermined time intervals by means of a computer. When a computer is used, automatic checks of the trigger threshold can be systematically provided. The foregoing detailed description has been provided merely to illustrate certain preferred embodiments of the present invention, and not to limit the scope of this invention. Rather, it is intended that the following claims, including all equivalents, define the scope of this invention.

I claim:

1. In a digital electric position measuring instrument comprising a scale having at least one division, a scanning unit for scanning the division to generate a scanning signal, means for mounting one of the scale and the scanning unit for relative movement with respect to the other of the scale and the scanning unit, and an evaluating unit having a trigger circuit for evaluating the scanning signal, the improvement comprising:

means for generating at least one test signal; and means for selectively applying the test signal to the trigger circuit temporarily to vary a trigger threshold of the trigger circuit by a selected amount;

said generating means and said applying means operating to provide a simple, reliable check of the trigger threshold of the trigger circuit.

2. In a digital photoelectric position measuring instrument comprising a scale having at least one division, a scaning unit for scanning the scale to generate a scanning signal, said scanning unit comprising a light source arranged to illuminate the scale, means for mounting one of the scale and the scanning unit for relative movement with respect to the other of the scale and the scanning unit, and an evaluating unit having a trigger circuit for evaluating the scanning signal, the improvement comprising:

means for generating at least one test signal; and means for selectively applying the test signal to the light source temporarily to vary the brightness of the light source by a selected amount;

said generating means and said applying means operating to provide a simple, reliable check of a trigger threshold of the trigger circuit, said selected amount chosen such that, in the event the trigger threshold is within a desired range of values, the selected amount does not interfere with normal operation of the trigger circuit and the position measuring instrument in measuring the relative position of the scanning unit with respect to the scale.

3. The invention of claim 1 or 2 wherein the generating means operates to generate two test signals of differing amplitudes, wherein the two test signals define a test range for the trigger threshold.

4. The invention of claim 1 or 2 wherein the generating means operates to generate two test signals, each of which is a direct-voltage signal, wherein the two test signals are of opposite polarities.

5. The invention of claim 3 wherein the generating means is adjustable such that the test signals can be varied, selectively to provide a coarse test range and a fine test range for the trigger threshold.

6. The invention of claim 1 or 2 wherein the evaluating unit indicates whether the trigger threshold is within a selected threshold range when the applying means applies the test signal and the relative position of the scale and the scanning unit is changed.

7. The invention of claim 1 or 2 wherein the evaluating unit indicates whether the trigger threshold is within a selected threshold range when the applying means applies the test signal and the scale is stationary with respect to the scanning unit.

8. The invention of claim 1 or 2 wherein the applying means is manually operated.

9. The invention of claim 1 or 2 wherein the applying means is adapted to be automatically controlled by a computer.

10. The invention of claim 1 or 2 wherein the measuring instrument further comprises:

means, responsive to a direct flux light signal, for adjusting the trigger threshold of the trigger circuit.

11. The invention of claim 10 wherein the adjusting means comprises an additional photosensitive element coupled to the trigger circuit.

12. The invention of claim 10 or 11 wherein the applying means acts to superimpose the test signal on the direct flux signal.

13. The invention of claim 1 wherein the selected amount is chosen such that, in the event the trigger threshold is within a desired range of values, the selected amount does not interfere with normal operation of the trigger circuit and the position measuring instrument in measuring the relative position of the scanning unit with respect to the scale.

14. In a digital photoelectric position measuring instrument comprising a scale having at least one division, a scanning unit for scanning the scale to generate a scanning signal, said scanning unit comprising a light source arranged to illuminate the scale, means for mounting one of the scale and the scanning unit for relative movement with respect to the other of the scale and the scanning unit, and an evaluating unit having a trigger circuit for evaluating the scanning signal, the improvement comprising:

means for generating two test signals of differing amplitudes;

means for selectively applying a selected one of the two test signals to the light source temporarily to vary the brightness of the light source by a selected amount;

said generating means and said applying means operating to provide a simple, reliable check of a trigger threshold of the trigger circuit, said two test signals defining a test range for the trigger threshold.

15. The invention of claim 14 wherein each of the two test signals is a direct-voltage.

16. The invention of claim 15 wherein the generating means is adjustable such that the test signals can be varied, selectively to provide a coarse test range and a fine test range for the trigger threshold.

* * * * *